United States Patent
Hosoda

(10) Patent No.: US 7,075,596 B2
(45) Date of Patent: Jul. 11, 2006

(54) LIQUID CRYSTAL PROJECTOR

(75) Inventor: Satoshi Hosoda, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 226 days.

(21) Appl. No.: 10/198,168

(22) Filed: Jul. 19, 2002

(65) Prior Publication Data

US 2003/0025854 A1 Feb. 6, 2003

(30) Foreign Application Priority Data

Aug. 1, 2001 (JP) ............................. 2001-233535

(51) Int. Cl.
*G02F 1/133* (2006.01)

(52) U.S. Cl. .......................... 349/72; 349/161; 353/52; 345/102

(58) Field of Classification Search .................. 349/72, 349/161; 345/101, 102, 204, 207; 353/52–61, 353/119
See application file for complete search history.

(56) References Cited

U.S. PATENT DOCUMENTS

| | | | | |
|---|---|---|---|---|
| 5,515,074 A | * | 5/1996 | Yamamoto | 345/101 |
| 5,842,761 A | * | 12/1998 | Futakami et al. | 353/119 |
| RE36,060 E | * | 1/1999 | Miyashita | 348/748 |
| 6,072,459 A | * | 6/2000 | Asakawa et al. | 345/101 |
| 6,111,630 A | * | 8/2000 | Watanuki et al. | 349/161 |
| 6,313,821 B1 | * | 11/2001 | Mizuno | 345/101 |
| 6,364,492 B1 | * | 4/2002 | Fujimori et al. | 353/119 |
| 6,419,364 B1 | * | 7/2002 | Takizawa et al. | 353/52 |
| 6,637,895 B1 | * | 10/2003 | Fujimori et al. | 353/119 |
| 6,710,762 B1 | * | 3/2004 | Hasegawa | 345/101 |
| 6,776,489 B1 | * | 8/2004 | Suzuki | 353/20 |

FOREIGN PATENT DOCUMENTS

| | | |
|---|---|---|
| JP | 06-221599 A | 8/1994 |
| JP | 10-186513 A | 7/1998 |
| JP | 2000-35613 A | 2/2000 |

OTHER PUBLICATIONS

Copy of Translation of Noitce of Rejection dated Dec. 7, 2005 for the corresponding Japanese patent application.

* cited by examiner

*Primary Examiner*—Steven S. Paik
*Assistant Examiner*—Kumiko C. Koyama
(74) *Attorney, Agent, or Firm*—Westerman, Hattori, Daniels & Adrian, LLP.

(57) ABSTRACT

A liquid crystal projector includes a reference temperature sensor, a comparison temperature sensor, and a shut-off unit for shutting off the power to a light source lamp for backlight when the difference between a temperature sensed by the reference temperature sensor and a temperature sensed by the comparison temperature sensor is more than a predetermined value. Used as the reference temperature sensor is a temperature sensor for sensing the ambient temperature of the main body of the liquid crystal projector, and used as the comparison temperature sensor is a temperature sensor for sensing the ambient temperature of a liquid crystal panel. Alternately, used as the reference temperature sensor is a temperature sensor for sensing the ambient temperature of the main body of the liquid crystal projector, and used as the comparison temperature sensor is a temperature sensor for sensing the ambient temperature of the light source lamp for backlight.

3 Claims, 6 Drawing Sheets

LIQUID CRYSTAL PROJECTOR

BACKGROUND OF THE INVENTION

1. Field of the Invention

The present invention relates to a liquid crystal projector.

2. Description of the Prior Art

A liquid crystal panel, a light source lamp for backlight arranged on a rear surface of the liquid crystal panel, a signal processing circuit, and a power supply circuit are provided in a casing of a liquid crystal projector. Further, a plurality of cooling fans for cooling the liquid crystal panel, the light source lamp for backlight, and so forth are provided in the casing of the liquid crystal projector.

FIG. 1 illustrates the schematic configuration of the liquid crystal projector.

The liquid crystal projector comprises an operation unit 1, a main control unit 2, a display unit 3, a storage unit 4, and a fan control unit 5. Three temperature sensors 11, 12, and 13 are connected to the main control unit 2. Five cooling fans 6 are connected to the fan control unit 5.

The first temperature sensor 11 is for measuring the ambient temperature of the main body of the liquid crystal projector (room temperature). The first temperature sensor 11 is arranged in the vicinity of a place which is not affected as greatly as possible by the inside of the main body of the liquid crystal projector and is correlated with the room temperature, for example, an air suction port inside the main body of the liquid crystal projector.

The second temperature sensor 12 is for measuring the ambient temperature of a liquid crystal panel, and is arranged inside the main body of the liquid crystal projector and around the liquid crystal panel.

The third temperature sensor 13 is for measuring the ambient temperature of a light source lamp for backlight and is arranged inside the main body of the liquid crystal projector and around the light source lamp for backlight.

As shown in FIG. 2, the main control unit 2 controls the cooling fan 6 in response to a temperature $T_{11}$ sensed by the first temperature sensor 11 (room temperature). That is, when it is judged that the room temperature is not more than a predetermined temperature T1 by the temperature $T_{11}$ sensed by the first temperature sensor 11, the voltage of the cooling fan 6 is set to a predetermined minimum value MIN. The relationship between the temperature $T_{11}$ sensed by the first temperature sensor 11 and the room temperature is indicated by a straight line a in FIG. 3. When it is judged that the room temperature is not less than T2 by the temperature $T_{11}$ sensed by the first temperature sensor 11, the voltage of the cooling fan 6 is set to a predetermined maximum value MAX.

When it is judged that the room temperature is between T1 and T2 by the temperature $T_{11}$ sensed by the first temperature sensor 11, the voltage of the cooling fan 6 is controlled in proportion to the room temperature. When it is judged that the room temperature reaches T3 by the temperature $T_{11}$ sensed by the first temperature sensor 11, it is judged that the temperature is abnormal, thereby performing shut-down processing. In the shut-down processing, the power to the light source lamp for backlight is shut down, and control of the cooling fan 6 based on the temperature $T_{11}$ sensed by the first temperature sensor 11 is carried out.

More specifically, when the temperature (the straight line a) $T_{11}$ sensed by the first temperature sensor 11 is not less than a first shut-down temperature $TS_{11}$, as shown in FIG. 3, shut-down processing is performed. When a temperature (a straight line b) $T_{12}$ sensed by the second temperature sensor 12 is not less than a second shut-down temperature $TS_{12}$, shut-down processing is performed. Further, when a temperature (a straight line c) $T_{13}$ sensed by the third temperature sensor 13 is not less than a third shut-down temperature $TS_{13}$, shut-down processing is performed.

As apparent from FIG. 3, each of the shut-down temperatures $TS_{11}$, $TS_{12}$, and $TS_{13}$ is set such that the shut-down processing is performed when the ambient temperature of the main body of the liquid crystal projector (room temperature) is around 40° C.

In a case where the main body of the liquid crystal projector is arranged in a narrow space, when at least a part of an exhaust hole or a suction hole in the main body of the liquid crystal projector is filled up, for example, the exhaust hole or the suction hole in the main body of the liquid crystal projector is covered with a sheet-shaped object, the flow of air by the cooling fan 6 gets worse, so that the temperature inside the main body rises. When the air does not flow well, the liquid crystal panel, the light source lamp for backlight, and so forth are rapidly heated up irrespective of the fact that the cooling fan is driven.

The second temperature sensor 12 for measuring the ambient temperature of the liquid crystal panel does not adhere to the liquid crystal panel and is arranged at a position slightly apart therefrom. The third temperature sensor 13 for measuring the ambient temperature of the light source lamp for backlight is also arranged at a position slightly apart from the light source lamp for backlight. Therefore, at least a part of the exhaust hole or the suction hole in the main body of the liquid crystal projector is filled up. Even if the liquid crystal panel, the light source lamp for backlight, and so forth are rapidly heated up, heat is transmitted to the temperature sensors 12 and 13 with a time difference, so that shut-down processing is not immediately performed. Accordingly, components which are particularly weak in heat, for example, the liquid crystal panel are damaged.

Specifically, when at least a part of the exhaust hole or the suction hole in the main body of the liquid crystal projector is filled up, the respective temperatures of the liquid crystal panel and the light source lamp rapidly rise. Correspondingly, the respective temperatures sensed by the temperature sensors 12 and 13 for sensing their ambient temperatures also rise, as indicated by straight lines b1 and c1 in FIG. 4. However, heat generated by the liquid crystal panel and heat generated by the light source lamp are not immediately transmitted to the temperature sensors 12 and 13, respectively. Therefore, it takes much time until the temperatures sensed by the temperature sensors 12 and 13 respectively reach the corresponding shut-down temperatures $TS_{12}$ and $TS_{13}$, so that the timing of performing the shut-down processing is delayed. Accordingly, the components which are particularly weak in heat, for example, the liquid crystal panel are damaged.

SUMMARY OF THE INVENTION

An object of the present invention is to provide a liquid crystal projector so adapted that shut-down processing can be performed, in a case where at least a part of an exhaust hole or a suction hole in the main body of a liquid crystal projector is filled up so that the flow of air by a cooling fan gets worse, thereby rapidly heating up a liquid crystal panel and a light source lamp, before components which are particularly weak in heat, for example, the liquid crystal panel are damaged.

A first liquid crystal projector according to the present invention is characterized by comprising a reference temperature sensor; a comparison temperature sensor; and means for shutting off the power to a light source lamp for backlight when the difference between a temperature sensed by the reference temperature sensor and a temperature sensed by the comparison temperature sensor is more than a predetermined value.

Used as the reference temperature sensor is a temperature sensor for sensing the ambient temperature of the main body of the liquid crystal projector, and used as the comparison temperature sensor is a temperature sensor for sensing the ambient temperature of a liquid crystal panel. Used as the reference temperature sensor is a temperature sensor for sensing the ambient temperature of the main body of the liquid crystal projector, and used as the comparison temperature sensor is a temperature sensor for sensing the ambient temperature of the light source lamp for backlight. It is preferable that the liquid crystal projector further comprises a cooling fan, and means for controlling the cooling fan on the basis of the temperature sensed by the reference temperature sensor.

A second liquid crystal projector according to the present invention is characterized by comprising a reference temperature sensor; a comparison temperature sensor; and a circuit for shutting off the power to a light source lamp for backlight when the difference between a temperature sensed by the reference temperature sensor and a temperature sensed by the comparison temperature sensor is more than a predetermined value.

Used as the reference temperature sensor is a temperature sensor for sensing the ambient temperature of the main body of the liquid crystal projector, and used as the comparison temperature sensor is a temperature sensor for sensing the ambient temperature of a liquid crystal panel. Used as the reference temperature sensor is a temperature sensor for sensing the ambient temperature of the main body of the liquid crystal projector, and used as the comparison temperature sensor is a temperature sensor for sensing the ambient temperature of the light source lamp for backlight. It is preferable that the liquid crystal projector further comprises a cooling fan, and a circuit for controlling the cooling fan on the basis of the temperature sensed by the reference temperature sensor.

A third liquid crystal projector according to the present invention is characterized by comprising a reference temperature sensor; a first comparison temperature sensor; a second comparison temperature sensor; means for shutting off the power to a light source lamp for backlight when the difference between a temperature sensed by the reference temperature sensor and a temperature sensed by the first comparison temperature sensor is more than a first predetermined value; and means for shutting off the power to the light source lamp for backlight when the difference between the temperature sensed by the reference temperature sensor and a temperature sensed by the second comparison temperature sensor is more than a second predetermined value, the reference temperature sensor being a temperature sensor for sensing the ambient temperature of the main body of the liquid crystal projector, the first comparison temperature sensor being a temperature sensor for sensing the ambient temperature of a liquid crystal panel, and the second comparison temperature sensor being a temperature sensor for sensing the ambient temperature of the light source lamp for backlight. It is preferable that the liquid crystal projector further comprises a cooling fan, and means for controlling the cooling fan on the basis of the temperature sensed by the reference temperature sensor.

A fourth liquid crystal projector according to the present invention is characterized by comprising a reference temperature sensor; a first comparison temperature sensor; a second comparison temperature sensor; a circuit for shutting off the power to a light source lamp for backlight when the difference between a temperature sensed by the reference temperature sensor and a temperature sensed by the first comparison temperature sensor is more than a first predetermined value; and a circuit for shutting off the power to the light source lamp for backlight when the difference between the temperature sensed by the reference temperature sensor and a temperature sensed by the second comparison temperature sensor is more than a second predetermined value, the reference temperature sensor being a temperature sensor for sensing the ambient temperature of the main body of the liquid crystal projector, the first comparison temperature sensor being a temperature sensor for sensing the ambient temperature of a liquid crystal panel, and the second comparison temperature sensor being a temperature sensor for sensing the ambient temperature of the light source lamp for backlight. It is preferable that the liquid crystal projector further comprises a cooling fan, and a circuit for controlling the cooling fan on the basis of the temperature sensed by the reference temperature sensor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
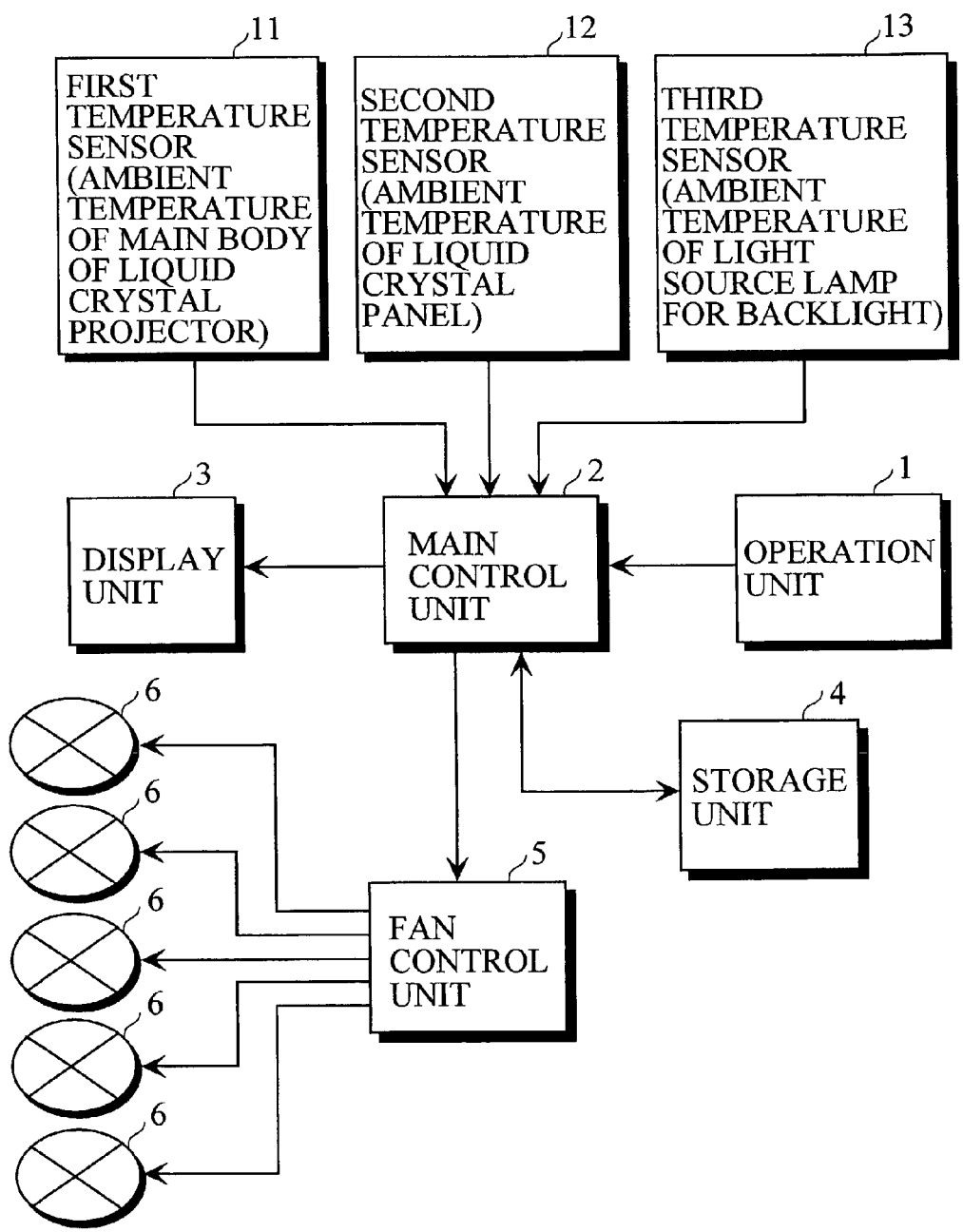
FIG. 1 is a schematic view showing the schematic configuration of a liquid crystal-projector.

Referring now to the drawing, an embodiment of the present invention will be described.

The schematic configuration of a liquid crystal projector is the same as that shown in FIG. 1. That is, the liquid crystal projector comprises an operation unit 1, a main control unit 2, a display unit 3, a storage unit 4, and a fan control unit 5. Three temperature sensors 11, 12, and 13 are connected to the main control unit 2. Five cooling fans 6 are connected to the fan control unit 5.

The first temperature sensor 11 is for measuring the ambient temperature of the main body of the liquid crystal projector (room temperature). The first temperature sensor 11 is arranged in the vicinity of a place which is not affected as greatly as possible by the inside of the main body of the liquid crystal projector and is correlated with the room temperature, for example, an air suction port inside the main body of the liquid crystal projector. The second temperature sensor 12 is for measuring the ambient temperature of a liquid crystal panel, and is arranged inside the main body of the liquid crystal projector and around the liquid crystal panel. The third temperature sensor 13 is for measuring the ambient temperature of a light source lamp for backlight, and is arranged inside the main body of the liquid crystal projector and around the light source lamp for backlight.

Figure 2:
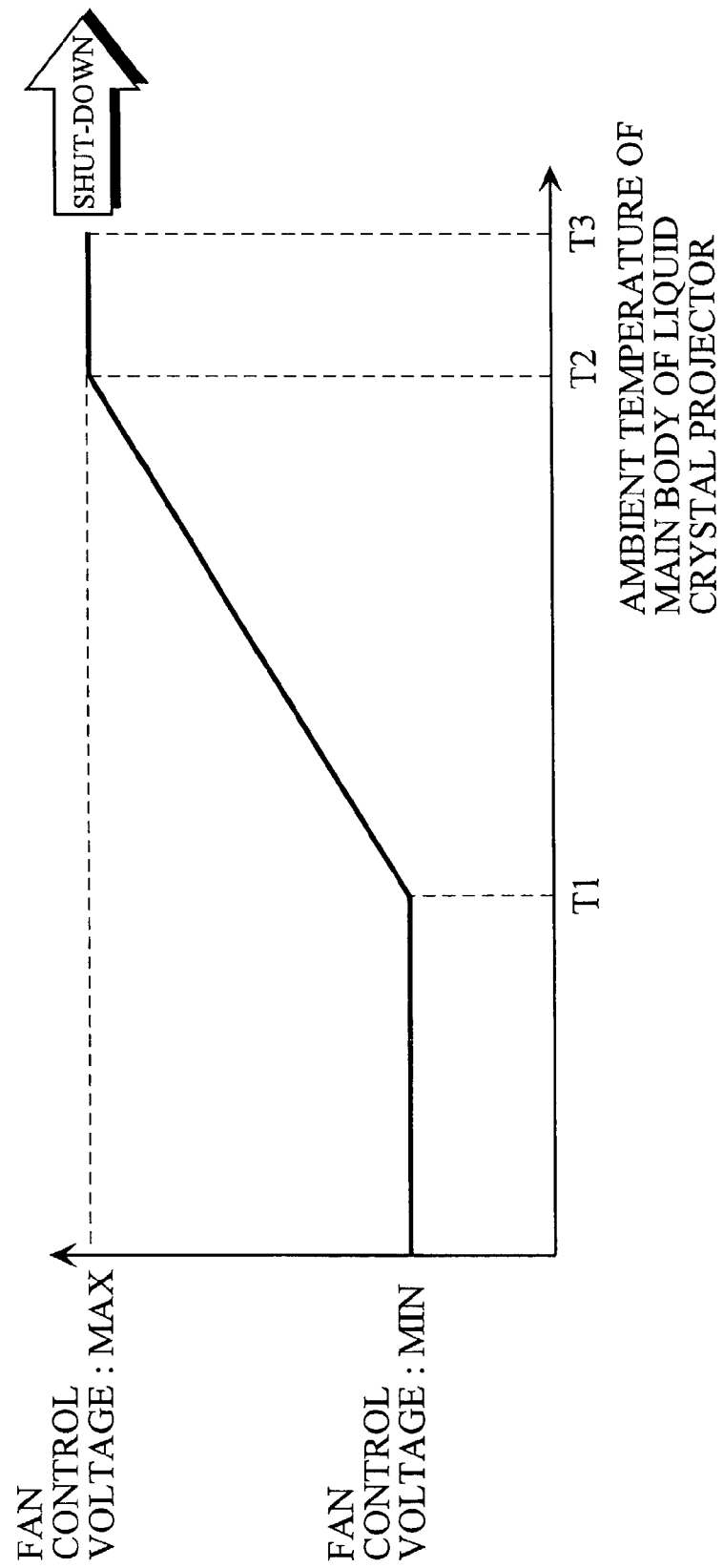
FIG. 2 is a graph showing the relationship between room temperature and a voltage for controlling a cooling fan.

The main control unit 2 controls the cooling fan 6 in response to a temperature sensed by the first temperature sensor 11 (the ambient temperature of the main body of the liquid crystal projector), as shown in FIG. 2.

Figure 3:
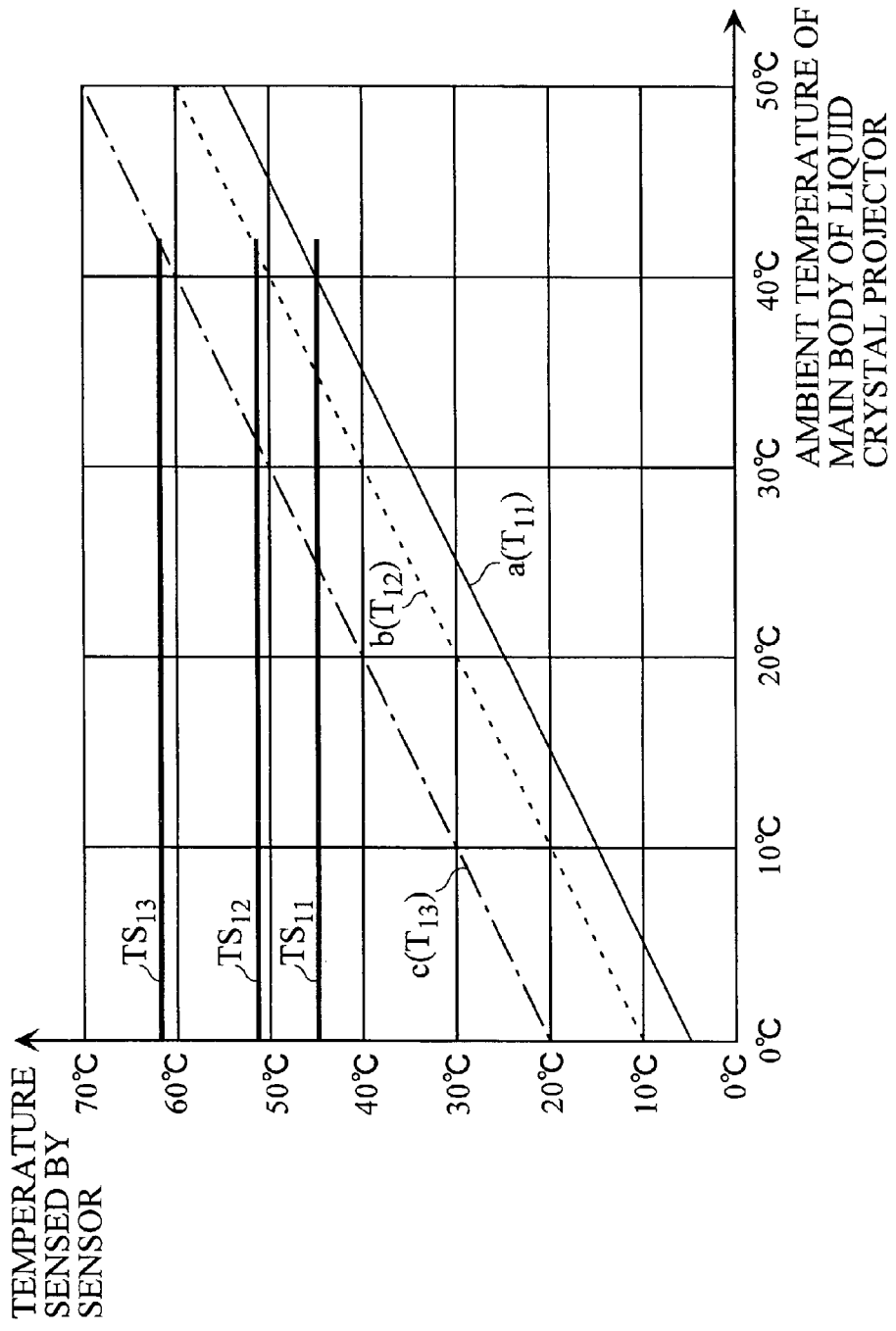
FIG. 3 is a graph showing the relationship between room temperature and a temperature sensed by each of temperature sensors 11, 12, and 13, and shut-down temperatures $TS_{11}$, $TS_{12}$, and $TS_{13}$ set for the respective temperature sensors 11, 12, and 13.

Furthermore, the main control unit 2 performs shut-down processing in cases where a temperature (a straight line a) $T_{11}$ sensed by the first temperature sensor 11 is not less than a first shut-down temperature $TS_{11}$, a temperature (a straight line b) $T_{12}$ sensed by the second temperature sensor 12 is not less than a second shut-down temperature $TS_{12}$, or a temperature (a straight line c) $T_{13}$ sensed by the third temperature sensor 13 is not less than a third shut-down temperature $TS_{13}$, as shown in FIG. 3.

Furthermore, in the present embodiment, in order that shut-down processing is performed before components which are particularly weak in heat, for example, the liquid crystal panel are damaged in a case where at least a part of an exhaust hole or a suction hole in the main body of the liquid crystal projector is filled up, the main control unit 2 performs the shut-down processing even when the following conditions 1 and 2 are satisfied.

Condition 1: in a case where the difference $(T_{12}-T_{11})$ between the temperature $T_{12}$ sensed by the second temperature sensor 12 (the ambient temperature of the liquid crystal panel) and the temperature $T_{11}$ sensed by the first temperature sensor 11 (the ambient temperature of the main body of the liquid crystal projector) is more than a predetermined threshold value Th1

Condition 2: in a case where the difference $(T_{13}-T_{11})$ between the temperature $T_{13}$ sensed by the third temperature sensor 13 (the ambient temperature of the light source lamp for backlight) and the temperature $T_{11}$ sensed by the first temperature sensor 11 (the ambient temperature of the main body of the liquid crystal projector) is more than a predetermined threshold value Th2

Figure 4:
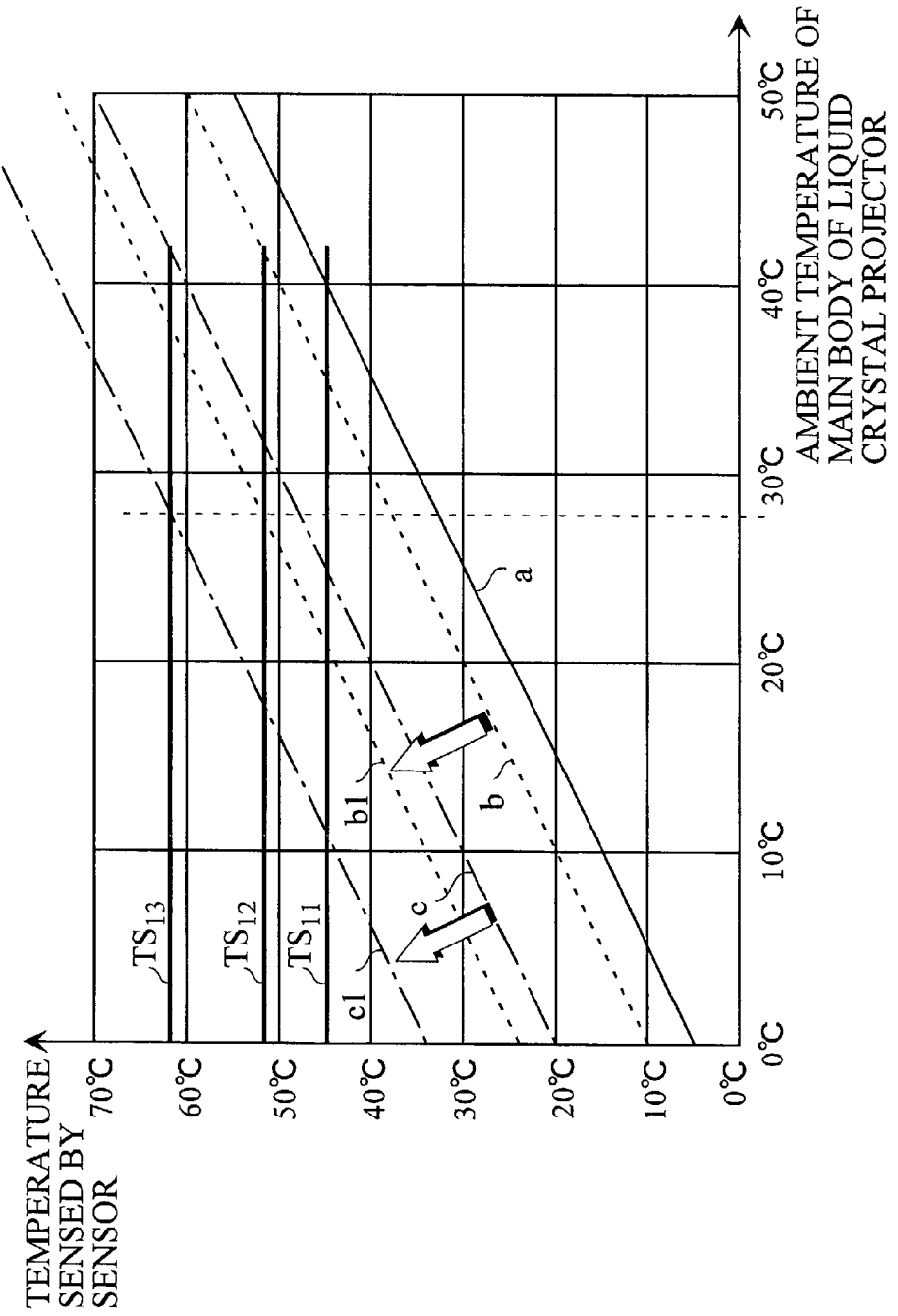
FIG. 4 is a graph for explaining the program of conventional shut-down control.

When at least a part of the exhaust hole or the suction hole in the main body of the liquid crystal projector is filled up, the respective temperatures of the liquid crystal panel and the light source lamp rapidly rise. Correspondingly, the respective temperatures sensed by the temperature sensors 12 and 13 for sensing their ambient temperatures also rise, as indicated by straight lines b1 and c1 in FIG. 4.

However, heat generated by the liquid crystal panel and heat generated by the light source lamp are not immediately transmitted to the temperature sensors 12 and 13, respectively. Therefore, it takes much time until the temperatures $T_{12}$ and $T_{13}$ sensed by the temperature sensors 12 and 13 respectively reach the corresponding shut-down temperatures $TS_{12}$ and $TS_{13}$.

In the present embodiment, therefore, the shut-down processing can be performed more quickly than that in the conventional example in a case where at least a part of the exhaust hole or the suction hole in the main body of the liquid crystal projector is filled up by performing the shut-down processing even when the difference $(T_{12}-T_{11})$ between the temperature $T_{12}$ sensed by the second temperature sensor 12 and the temperature $T_{11}$ sensed by the first temperature sensor 11 is more than the threshold value Th1 or when the difference $(T_{13}-T_{11})$ between the temperature $T_{13}$ sensed by the third temperature sensor 13 and the temperature $T_{11}$ sensed by the first temperature sensor 11 is more than the threshold value Th2.

Figure 5:
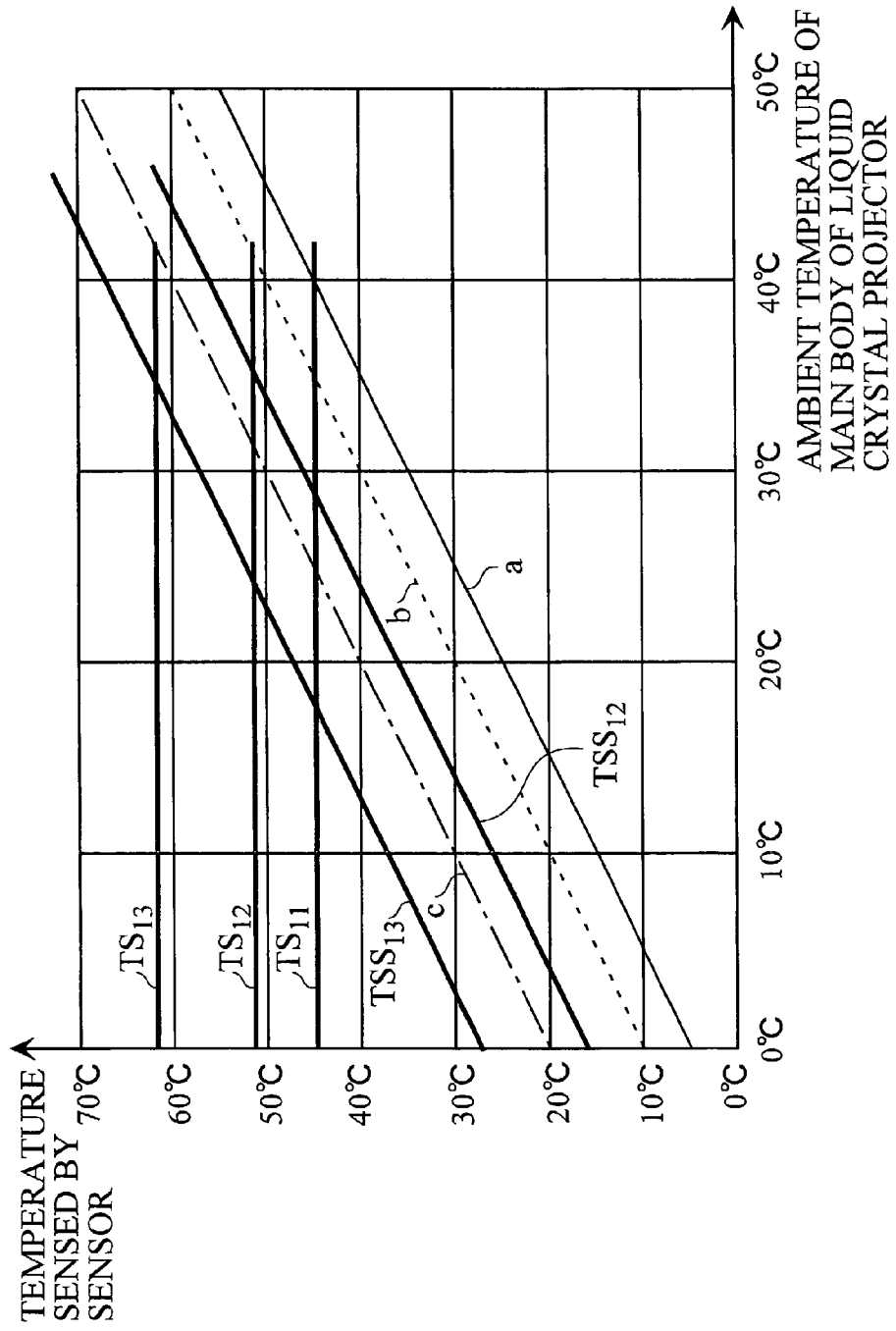
FIG. 5 is a graph showing shut-down temperatures $TSS_{12}$ and $TSS_{13}$ which are substantially added by an embodiment of the present invention.

Consequently, $TSS_{12}$ shown in FIG. 5 is substantially added as a shut-down temperature corresponding to the second temperature sensor 12. Similarly, $TSS_{13}$ shown in FIG. 5 is substantially added as a shut-down temperature corresponding to the third temperature sensor 13.

Figure 6:
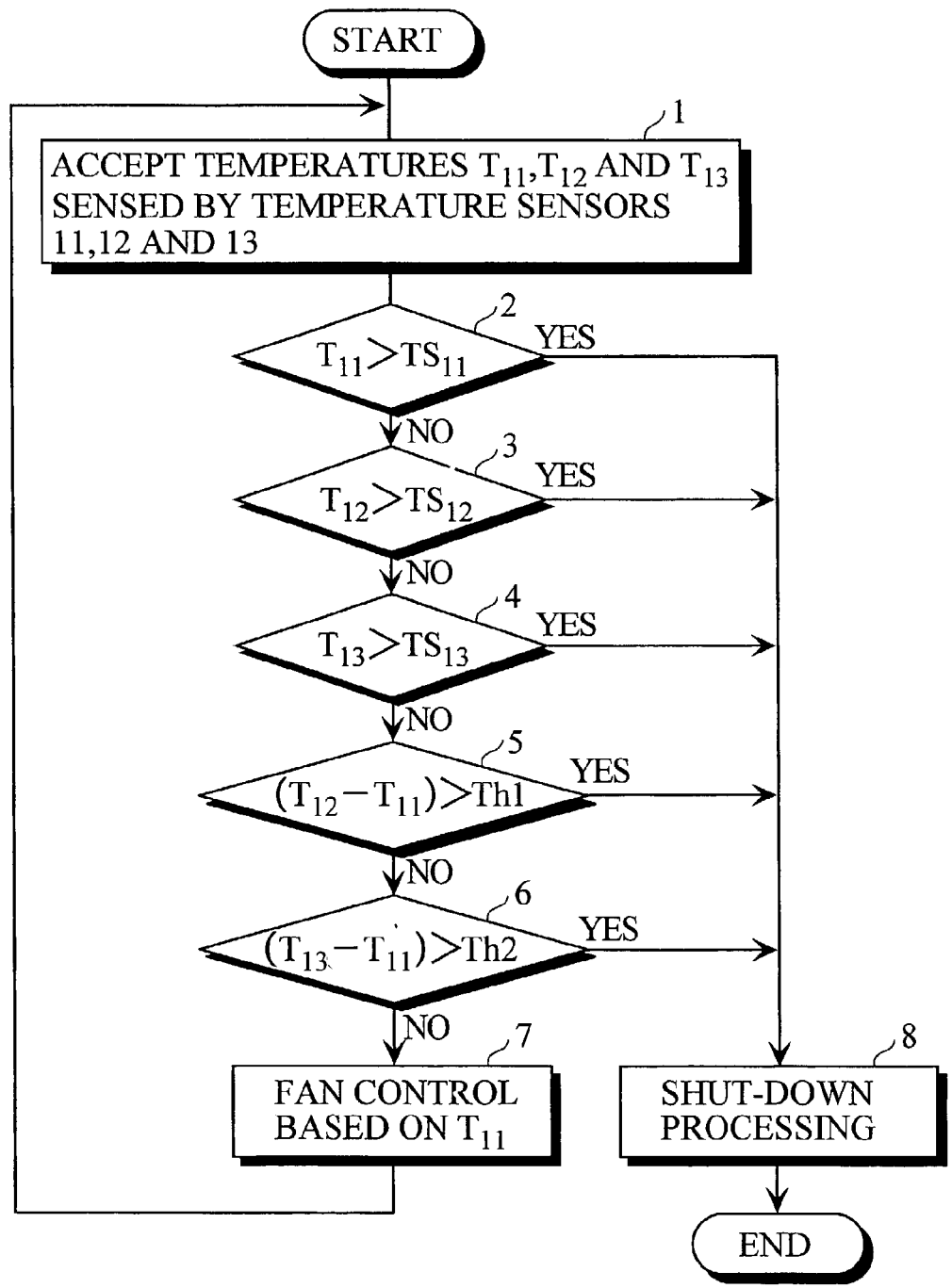
FIG. 6 is a flow chart showing the procedure for shut-down control processing by a main control unit 2.

FIG. 6 shows the procedure for shut-down control processing by the main control unit 2.

The temperatures $T_{11}$, $T_{12}$, and $T_{13}$ sensed by the temperature sensors 11, 12, and 13 are accepted for each predetermined time period (step 1).

It is judged whether or not the temperature $T_{11}$ sensed by the first temperature sensor 11 (the ambient temperature of the main body of the liquid crystal projector) is more than the first shut-down temperature $TS_{11}$ (step 2). If the temperature $T_{11}$ sensed by the first temperature sensor 11 is more than the first shut-down temperature $TS_{11}$, shut-down processing is performed (step 8). The current shut-down control processing is terminated.

If the temperature $T_{11}$ sensed by the first temperature sensor 11 is not more than the first shut-down temperature $TS_{11}$, it is judged whether or not the temperature $T_{12}$ sensed by the second temperature sensor 12 (the ambient temperature of the liquid crystal panel) is more than the second shut-down temperature $TS_{12}$ (step 3). If the temperature $T_{12}$ sensed by the second temperature sensor 12 is more than the second shut-down temperature $TS_{12}$, shut-down processing is performed (step 8). The current shut-down control processing is terminated.

If the temperature $T_{12}$ sensed by the second temperature sensor 12 is not more than the second shut-down temperature $TS_{12}$, it is judged whether or not the temperature $T_{13}$ sensed by the third temperature sensor 13 (the ambient temperature of the light source lamp for backlight) is more than the third shut-down temperature $TS_{13}$ (step 3). If the temperature $T_{13}$ sensed by the third temperature sensor 13 is more than the third shut-down temperature $TS_{13}$, shut-down processing is performed (step 8). The current shut-down control processing is terminated.

If the temperature $T_{13}$ sensed by the third temperature sensor 13 is not more than the third shut-down temperature $TS_{13}$, it is judged whether or not the difference $(T_{12}-T_{11})$ between the temperature $T_{12}$ sensed by the second temperature sensor 12 (the ambient temperature of the liquid crystal panel) and the temperature $T_{11}$ sensed by the first temperature sensor 11 (the ambient temperature of the main body of the liquid crystal projector) is more than a threshold value Th1 (step 5). If the temperature difference $(T_{12}-T_{11})$ is more than the threshold value Th1, shut-down processing is performed (step 8). The current shut-down control processing is terminated.

If the temperature difference $(T_{12}-T_{11})$ is not more than the threshold value Th1, the difference $(T_{13}-T_{11})$ between the temperature $T_{13}$ sensed by the third temperature sensor 13 (the ambient temperature of the light source lamp for backlight) and the temperature $T_{11}$ sensed by the first temperature sensor 11 (the ambient temperature of the main body of the liquid crystal projector) is more than the threshold value Th2 (step 6) If the temperature difference $(T_{13}-T_{11})$ is more than the threshold value Th2, shut-down processing is performed (step 8). The current shut-down control processing is terminated.

If the temperature difference ($T_{13}-T_{11}$) is not more than the threshold value Th2, the voltage of the cooling fan is controlled on the basis of the temperature $T_{11}$ sensed by the first temperature sensor 11 (the ambient temperature of the main body of the liquid crystal projector) (step 7). The program is returned to the step 1.

According to the present invention, in a case where the flow of air by the cooling fan gets worse when at least a part of the exhaust hole or the suction hole in the main body of the liquid crystal projector is filled up, so that the liquid crystal panel and the light source lamp are rapidly heated up, shut-down processing can be performed before the components which are particularly weak in heat, for example, the liquid crystal panel are damaged.

Although the present invention has been described and illustrated in detail, it is clearly understood that the same is by way of illustration and example only and is not to be taken by way of limitation, the spirit and scope of the present invention being limited only by the terms of the appended claims.

What is claimed:

1. A liquid crystal projector comprising:
   a first temperature sensor, for sensing the ambient temperature of the main body of the liquid crystal projector;
   a second temperature sensor, for sensing the ambient temperature of a liquid crystal panel;
   means for shutting off the power to a light source lamp for backlight when a temperature sensed by the first temperature sensor is not less than a first shut-off temperature;
   means for shutting off the power to the light source lamp for backlight when a temperature sensed by the second temperature sensor is not less than a second shut-off temperature; and
   means for shutting off the power to the light source lamp for backlight when the difference between a temperature sensed by the first temperature sensor and a temperature sensed by the second temperature sensor is more than a predetermined value.

2. A liquid crystal projector comprising:
   a first temperature sensor, for sensing the ambient temperature of the main body of the liquid crystal, projector;
   a second temperature sensor, for sensing the ambient temperature of a light source lamp for backlight;
   means for shutting off the power to the light source lamp for backlight when a temperature sensed by the first temperature sensor is not less than a first shut-off temperature;
   means for shutting off the power to the light source lamp for backlight when a temperature sensed by the second temperature sensor is not less than a second shut-off temperature; and
   means for shutting off the power to the light source lamp for backlight when the difference between a temperature sensed by the first temperature sensor and a temperature sensed by the second temperature sensor is more than a predetermined value.

3. A liquid crystal projector comprising:
   a first temperature sensor for sensing the ambient temperature of the main body of the liquid crystal projector;
   a second temperature sensor for sensing the ambient temperature of a liquid crystal panel;
   a third temperature sensor for sensing the ambient temperature of a light source lamp for backlight;
   means for shutting off the power to the light source lamp for backlight when a temperature sensed by the first temperature sensor is not less than a first shut-off temperature;
   means for shutting off the power to the light source lamp for backlight when a temperature sensed by the second temperature sensor is not less than a second shut-off temperature;
   means for shutting off the power to the light source lamp for a backlight when a temperature sensed by the third temperature sensor is not less than a third shut-off temperature;
   means for shutting off the power to the light source lamp for backlight when the difference between a temperature sensed by the first temperature sensor and a temperature sensed by the second temperature sensor is more than a first predetermined value; and
   means for shutting off the power to the light source lamp for backlight when the difference between a temperature sensed by the first temperature sensor and a temperature sensed by the third temperature sensor is more than a second predetermined value.

* * * * *